United States Patent [19]

Weil

[11] Patent Number: 4,761,302

[45] Date of Patent: Aug. 2, 1988

[54] FLUORINATION OF AMORPHOUS THIN-FILM MATERIALS WITH XENON FLUORIDE

[75] Inventor: Raoul B. Weil, Haifa, Israel

[73] Assignee: The United States Department of Energy, Washington, D.C.

[21] Appl. No.: 45,920

[22] Filed: May 1, 1987

[51] Int. Cl.$^4$ .................... B05D 3/06; C23C 16/00
[52] U.S. Cl. .................... 427/39; 427/255.1
[58] Field of Search .................. 427/39, 255.1

[56] References Cited

U.S. PATENT DOCUMENTS

| 4,226,898 | 10/1980 | Ovshinsky et al. | 427/39 |
| 4,452,828 | 6/1984 | Namba et al. | 427/39 |
| 4,485,121 | 11/1984 | Matsummura | 427/39 |
| 4,522,663 | 6/1985 | Ovshinsky et al. | 427/39 |
| 4,544,423 | 6/1985 | Tsuge et al. | 427/39 |
| 4,608,097 | 8/1986 | Weinberger et al. | 427/155 |
| 4,637,938 | 1/1987 | Lee et al. | 427/53.1 |

FOREIGN PATENT DOCUMENTS 691933 9/1977 U.S.S.R. .
1180065 3/1984 U.S.S.R. .

Primary Examiner—John H. Newsome
Assistant Examiner—Marianne Padgett
Attorney, Agent, or Firm—Kenneth Richardson; James W. Weinberger; Judson R. Hightower

[57] ABSTRACT

A method is disclosed for producing fluorine-containing amorphous semiconductor material, preferably comprising amorphous silicon. The method includes depositing amorphous thin-film material onto a substrate while introducing xenon fluoride during the film deposition process.

18 Claims, No Drawings

FLUORINATION OF AMORPHOUS THIN-FILM MATERIALS WITH XENON FLUORIDE

CONTRACTUAL ORIGIN OF THE INVENTION

The United States Government has rights in this invention under Contract No. DE-AC02-83CH10093 between the U. S. Department of Energy and the Solar Energy Research Institute, a division of the Midwest Research Institute.

BACKGROUND OF THE INVENTION

1. Field of the Invention

The present invention relates generally to processes for producing amorphous semiconductor films having materials incorporated therein to produce desirable photoconductive properties and, more particularly, to a process for incorporating fluorine into such semiconductor films. Specifically, the present invention relates to an improved process for producing fluorine-containing amorphous silicon semiconductor materials and the like.

2. Description of the Prior Art

Amorphous thin-film materials have been utilized as semiconductors in a variety of applications. One particularly important use is in solar cells wherein such amorphous thin-films frequently comprise silicon, germanium or mixtures of one or both with other substances. Such amorphous semiconductor films may be additionally doped or mixed with other elements to enhance performance of such semiconductor cells by reducing or even eliminating localized states in the energy gap, such as dangling bonds, recombination centers, and the like. A preferred combination is that of mixing or incorporating fluorine into an amorphous substrate material and in particular amorphous silicon, since it has been found that hydrogenated amorphous silicon containing fluorine suffers less illuminationinduced degradation in the electronic transport properties than pure hydrogenated amorphous silicon.

Heretofore, fluorine-containing amorphous semiconductors have been produced by decomposing either mixed gases of silicon tetrafluoride ($SiF_4$) gas with hydrogen ($H_2$) gas or silicon tetrafluoride gas with silane ($SiH_4$) gas, utilizing glow discharge techniques such as described in U. S. Pat. No. 4,226,898. Another method of producing fluorine-containing amorphous semiconductor materials includes mixing silicon difluoride ($SiF_2$) gas or silicon monofluoride ($SiF$) gas with hydrogen gas or hydrogen atom (H) gas, decomposing the mixed gas by electric discharge, and then depositing silicon from the decomposed gas on a substrate as disclosed in U. S. Pat. No. 4,485,121.

Yet another prior art technique for incorporating fluorine into silicon layers includes utilizing plasma CVD techniques, such as by decomposing monosilane ($SiH_4$) or tetrafluorosilane ($SiF_4$) by means of low-pressure glow discharge.

However, the production methods of these references have certain disadvantages in that the incorporation of fluorine into the amorphous semiconductor material often cannot be satisfactorily controlled. Thus whil fluorine is high in bonding energy to silicon and should be inherently stable, the thermal stability is not improved as compared to that of the prior amorphous semiconductors which do not contain fluorine. Further, the electrooptical properties, such as photoconductivity and photosensitivity, are at best equal or even inferior to those of amorphous semiconductors not containing fluorine. Consequently, there still exists a need for a viable process for incorporating fluorine into amorphous semiconductor materials which is both inexpensive as well as satisfactorily controllable.

SUMMARY OF THE INVENTION

Accordingly, it is one object of the present invention to provide a method for incorporating fluorine into amorphous semiconductor material such as silicon.

It is another object of the present invention to provide a process for producing amorphous semiconductor material containing fluorine.

Yet a further object of the present invention is to provide an economical process for producing semiconductor films for solar cells which have reduced localized states in the energy gaps thereby resulting in highly efficient amorphous materials.

To achieve the foregoing and other objects and in accordance with the present invention, a method is provided for producing a fluorine-containing amorphous semiconductor material, preferably comprising silicon. The method includes depositing the amorphous material on a substrate and introducing xenon fluoride ($XeF_2$) during the film-deposition process so as to incorporate fluorine into the film as it is formed on the substrate.

DETAILED DESCRIPTION OF THE PREFERRED EMBODIMENTS

As indicated above, the present invention has as a principal objective to produce amorphous silicon semiconductor films, although many aspects of the invention are applicable to the production of films made from various other amorphous semiconductor materials. The films generally include individual elements or mixtures or alloys of elements falling into Groups III-VI of the Periodic Table, and in particular amorphous silicon and germanium from Group IV.

Pure amorphous silicon or germanium layers generally have microvoids, dangling bonds and various other structural defects which produce a high density of localized states in the energy gaps thereof. This in turn results in a lower degree of photoconductivity and short diffusion lengths, generally making such films unsuitable for solar cell applications.

When fluorine is incorporated in such amorphous films, the fluorine combines at an optimum temperature with many of the dangling bonds of the silicon to substantially decrease the density of the localized states in the energy gap. This makes the amorphous material functionally closer to its corresponding crystalline material. Thus, if fluorine can be incorporated throughout the amorphous silicon matrix as the silicon is being deposited, it will operate to satiate or cap the dangling bonds and other defects and thereby alter the semiconductor matrix in a way to reduce the number of defects formed.

The amorphous semiconductors produced by the method of the present invention include fluorine-containing amorphous semiconductor films of silicon, germanium or mixtures thereof, in which a fluorine-containing amorphous silicon, germanium or mixture thereof, is a basic skeleton which may contain other elements therein, for example, fluorine-containing silicon carbide or amorphous silicon-germanium.

The process step of depositing the amorphous material onto a substrate may be accomplished by one of any number of well-known deposition techniques such as radio frequency (RF) glow discharge processes, discharge processes which do not cause glow, arc discharge processes, vacuum deposition, chemical vapor deposition (CVD) processes, and the like. These various processes are well-known techniques, some of which are disclosed in the previously referenced patents. Consequently, details of such known process techniques will not be further discussed herein.

A preferred manner of depositing the amorphous material, and in particular silicon, onto a substrate is that of radio frequency glow discharge. In this process, a deposition chamber is provided which includes an atmosphere of silicon-containing gas. The silicon-containing gas may be $SiH_4$ or $SiH_4$ diluted with $H_2$ and/or Ar. In the case of vacuum deposition of amorphous silicon thin-films, the deposition atmosphere can also be a vacuum. Moreover, other amorphous thin-films such as amorphous germanium, amorphous silicon-carbon or amorphous silicon-germanium mixtures cn be grown from gaseous atmospheres in the chamber containing the appropriate elements.

In the case of RF glow discharge, a pair of spaced-apart electrodes are positioned within the chamber, one being a high-frequency electrode supporting the substrate onto which the amorphous silicon is deposited during the glow discharge. In the preferred embodiment of the invention, $XeF_2$ is selected as the fluorine-containing gas. In this instance, xenon fluoride ($XeF_2$) is preferably streamed directly into the glow discharge zone located midway between the electrodes through a grounded stainless steel tube. However, any manner of introducing the xenon fluoride into the deposition chamber may be utilized. Moreover, xenon fluoride is preferably introduced into the chamber in the form of a powder.

As the xenon fluoride is introduced during the glow discharge process of depositing silicon onto the substrate, fluorine interacts with the dangling bonds of the silicon at the surface of formation so as to be incorporated therein. As additional silicon is deposited, the fluorine is continually incorporated within the body of the silicon layer. As a result, a thin-film layer of silicon material having fluorine intimately intermixed and incorporated therewithin is formed. In so doing, the density of localized states in the energy gap is substantially reduced to make the fluorinated silicon more closely equivalent to that of crystalline silicon in semiconductor properties. While fluorine in amorphous silicon is not per se new, prior deposition techniques utilized atmospheres containing $SiF_4$ and $H_2$ together or an atmosphere of $SiF_2$. Xenon fluoride has not previously been considered as a source of fluorine in the glow discharge deposition of silicon substrates. In fact, xenon fluoride has only been previously used in conjunction with amorphous silicon thin-film layers for purposes of etching the surfaces of formed amorphous silicon, not for providing a source of fluorine during the deposition process itself. Thus, the decompositon of xenon fluoride in the chamber to provide a source of fluorine results in a fluorinated silicon substrate having substantially improved semiconductor properties.

The temperatures and chamber pressures during which the flow discharge process takes place when the xenon fluoride introduction also occurs are standard temperature and pressure ranges. More specifically, the temperature range is preferably 250°–600° C. However, it should be noted that unlike prior art techniques, substrate temperature in this process is not critical.

As previously indicated, other deposition techniques may be utilized in lieu of the preferred glow discharge technique. Moreover, the introduction of the xenon fluoride into the chmber may be at a constant flow rate or may be pulsed depending on the desired substrate formation and fluorine layering.

Examples of the specific formation of amorphous semiconductor material incorporating fluorine are illustrated below.

EXAMPLE I

An RF Glow Discharge Chamber was arranged having a pair of spaced-apart electrodes, one being a high-frequency electrode supporting a substrate onto which amorphous silicon was deposited during the glow discharge. A grounded stainless steel tube was positioned for delivering xenon fluoride directly into the glow discharge zone between the two electrodes. 895 mTorr of pure $SiH_4$ flowing at a rate of 90 standard cubic centimeters per minute (sccm) were introduced into the chamber as the deposition atmosphere. 25 mTorr of $XeF_2$ were admixed with the deposition atmosphere at a flow rate of 1.1 sccm. The R F glow discharge was excited at 13.6 MHz at a power density of 0.15 watts/cm$^2$. The resultant film incorporated 4.3% of fluorine as determined by ESCA (Electron Spectroscopy for Chemical Analysis) and had a growth rate of 3.3 Angstroms/second.

As can be seen from the above, a process for incorporating fluorine into amorphous thin-film semiconductor material, and especially silicon, is provided wherein fluorine is intimately intermixed and buried within the silicon film as it is being grown and formed. In this manner, amorphous silicon or other amorphous thin-film semiconductor materials can be produced which more closely resemble pure crystalline material yet share in the advantageous economics of utilizing amorphous materials for semiconductor applications and in particular solar energy applications. The particular process of the present invention overcomes some of the disadvantages of prior art processes which were slow, expensive, cumbersome, or not particularly uniform. This particular process is inexpensive to operate and results in a uniform intermingling of fluorine within the silicon film as it is grown.

The foregoing description of the processes of the present invention are exemplary, and the scope of the present invention is to be limited only to the claims as interpreted in view of the prior art. Equivalent methods and processes may be employed, as described, to provide the objectives and advantages described herein.

The embodiments of the invention in which an exclusive property or privilege is claimed are defined as follows:

1. A method for producing fluorine-containing amorphous semiconductor material comprising depositing amorphous semiconductor material on a substrate and introducing $XeF_2$ during said film deposition process to intimately intermix fluorine throughout said semiconductor material.

2. The method of claim 1, wherein said amorphous semiconductor material comprises silicon.

3. The method of claim 2, wherein said amorphous silicon material is deposited onto said substrate by placing said substrate in a deposition chamber and introducing a mixed silicon gas into said chamber.

4. The method of claim 3, wherein said mixed silicon gas is selected from the group consisting of $SiH_4$, $SiH_4$ diluted with $H_2$, and $SiH_4$ diluted with Ar.

5. The method of claim 2, wherein said amorphous silicon semiconductor material comprises a thin film selected from the group consisting of amorphous silicon, amorphous silicon-carbon, and amorphous silicon-germanium.

6. The method of claim 3, wherein said mixed gaseous silicon is deposited onto said substrate within said chamber utilizing radio frequency (RF) glow discharge techniques.

7. The method of claimed in claim 6, wherein said RF glow discharge technique comprises establishing a high frequency electrode disposed within said chamber to support said substrate, spacing a grounded electrode from said high-frequency electrode, and streaming said $XeF_2$ into the zone between said electrodes.

8. The method as claimed in claim 7, wherein said method further includes providing a grounded stainless steel tube through which said $XeF_2$ is streamed directly into the glow discharge zone midway between said grounded electrode and said high-frequency electrode.

9. The method of claim 8, wherein said deposition atmosphere comprises $SiH_4$.

10. The method of claim 3, wherein said deposition atmosphere is a vacuum, and said silicon is deposited onto said substrate by vacuum deposition.

11. The method of claim 3, wherein said silicon is deposited onto said substrate by chemical vapor deposition.

12. The method of claim 2, wherein powdered $XeF_2$ is introduced into the deposition atmosphere in which said amorphous silicon material is growing on said substrate.

13. A process for incorporating fluorine into amorphous thin-film material comprising depositing amorphous thin-film material onto a substrate, said amorphous material being selected from the group consisting of silicon, germanium, or mixtures thereof, and introducing $XeF_2$ during said thin-film deposition process to incorporate and intimately intermix fluorine into said thin-film material.

14. The process as claimed in claim 13, wherein said thin-film material is deposited onto said substrate by providing a deposition atmosphere comprising mixed gaseous silicon selected from the group consisting of $SiH_4$, $SiH_4$ mixed with $H_2$, or $SiH_4$ mixed with Ar.

15. The process as claimed in claim 13, wherein said amorphous thin-film material is deposited on said substrate utilizing a technique selected from the group consisting of radio frequency (RF) glow discharge, vacuum deposition, and chemical vapor deposition.

16. The process as claimed in claim 13, wherein said $XeF_2$ is introduced in powder form.

17. The process as claimed in claim 13, wherein said amorphous thin-film material is deposited onto said substrate within a deposition chamber by radio frequency glow discharge having a high-frequency electrode supporting said substrate.

18. The process as claimed in claim 17, wherein said $XeF_2$ is introduced in between said high-frequency electrode and a grounded electrode spaced from said high-frequency electrode.

* * * * *